(12) United States Patent
Wang et al.

(10) Patent No.: US 10,915,775 B2
(45) Date of Patent: Feb. 9, 2021

(54) NOISE DETECTION CIRCUIT, NOISE DETECTION METHOD, AND PRINT RECOGNITION APPARATUS

(71) Applicant: BOE Technology Group Co., Ltd., Beijing (CN)

(72) Inventors: Pengpeng Wang, Beijing (CN); Haisheng Wang, Beijing (CN); Xiaoliang Ding, Beijing (CN); Chih-Jen Cheng, Beijing (CN); Yanling Han, Beijing (CN); Wei Liu, Beijing (CN); Xueyou Cao, Beijing (CN); Ping Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 140 days.

(21) Appl. No.: 16/131,418

(22) Filed: Sep. 14, 2018

(65) Prior Publication Data

US 2019/0213432 A1 Jul. 11, 2019

(30) Foreign Application Priority Data

Jan. 9, 2018 (CN) .......................... 2018 1 0018077

(51) Int. Cl.
*G06K 9/03* (2006.01)
*G06K 9/00* (2006.01)
*H03K 17/687* (2006.01)
*H03M 1/12* (2006.01)
*G11C 27/02* (2006.01)

(52) U.S. Cl.
CPC ............ *G06K 9/036* (2013.01); *G06K 9/0002* (2013.01); *G06K 9/0004* (2013.01); *G06K 9/0051* (2013.01); *H03K 17/6871* (2013.01); *G06K 9/0008* (2013.01); *G11C 27/02* (2013.01); *H03M 1/12* (2013.01)

(58) Field of Classification Search
None
See application file for complete search history.

(56) References Cited

U.S. PATENT DOCUMENTS

2005/0073324 A1* 4/2005 Umeda ............... G01R 27/2605
324/662
2008/0284885 A1* 11/2008 Taura ................... H04N 5/3575
348/300

(Continued)

*Primary Examiner* — Benjamin X Casarez
(74) *Attorney, Agent, or Firm* — Arent Fox LLP; Michael Fainberg

(57) ABSTRACT

Disclosed are a noise detection circuit, a noise detection method, and a print recognition apparatus. The noise detection circuit includes a differential amplifier, an analog-to-digital converter, a control circuit, and a first switch circuit; the control circuit is configured to control the first switch circuit to make the first input signal terminal connected with the reference signal terminal or grounded, and to make the second input signal terminal connected with the reference signal terminal or grounded, and when the first input signal terminal is connected with the reference signal terminal or grounded, and the second input signal terminal is connected with the reference signal terminal or grounded, to analyze the digital signal output by the analog-to-digital converter to determine a source of noise of the print recognition apparatus.

17 Claims, 7 Drawing Sheets

(56) References Cited

U.S. PATENT DOCUMENTS

| | | | |
|---|---|---|---|
| 2009/0147191 A1* | 6/2009 | Nakajima | G06F 3/0421 349/116 |
| 2011/0074446 A1* | 3/2011 | Chou | G06F 3/0418 324/679 |
| 2012/0169641 A1* | 7/2012 | Wang | G06F 3/0418 345/173 |
| 2015/0205414 A1* | 7/2015 | Hu | G06F 3/044 345/174 |
| 2015/0254491 A1* | 9/2015 | Mo | G06F 3/0416 345/174 |
| 2016/0148034 A1* | 5/2016 | Kremin | G06K 9/0002 382/124 |
| 2016/0307019 A1* | 10/2016 | Zhang | G06K 9/0002 |
| 2016/0350577 A1* | 12/2016 | Yang | G06K 9/00053 |
| 2017/0083735 A1* | 3/2017 | Wen | G06K 9/00 |
| 2017/0124370 A1* | 5/2017 | He | G06K 9/0012 |
| 2017/0330014 A1* | 11/2017 | Ramberg | G06K 9/0002 |
| 2018/0052558 A1* | 2/2018 | Wang | G06F 3/0416 |
| 2018/0074004 A1* | 3/2018 | Lin | G06F 3/044 |
| 2018/0136761 A1* | 5/2018 | Jiang | G06F 3/0414 |

* cited by examiner

NOISE DETECTION CIRCUIT, NOISE DETECTION METHOD, AND PRINT RECOGNITION APPARATUS

CROSS-REFERENCE TO RELATED APPLICATION

This Application claims priority to Chinese Patent Application No. 201810018077.X, filed on Jan. 9, 2018, the content of which is incorporated by reference in the entirety.

Technical Field

This disclosure relates to the field of touch technologies, and particularly to a noise detection circuit, a noise detection method, and a print recognition apparatus.

Description of the Related Art

Although the existing print recognition apparatuses include capacitive, ultrasonic, resistive, etc., and have respective advantages and disadvantages, their common disadvantage lies in a short sensing distance of a sensor, and this disadvantage has seriously restrained the structures and performances of the print recognition apparatuses, thus hindering them from being widely applied to mobile terminal products.

Optical print recognition inherently has an advantage of a long sensing distance due to its optical mode, but an optical sensor has to be made very small due to its required high resolution, and also since a signal is typically in direct proportion to an area of a sensor, the signal thereof may become rather weak, so a signal to noise ratio is typically improved by using an active detection circuit to detect a print signal, such as a fingerprint signal or the like.

SUMMARY

Embodiments of the disclosure provide a noise detection circuit, a noise detection method and a print recognition apparatus.

In an aspect, the embodiments of the disclosure provide a noise detection circuit, including a differential amplifier, an analog-to-digital converter, a control circuit, and a first switch circuit, wherein: a negative input terminal of the differential amplifier is connected with a first input signal terminal, a positive input terminal of the differential amplifier is connected with a second input signal terminal, and an output terminal of the differential amplifier is connected with an input terminal of the analog-to-digital converter; an output terminal of the analog-to-digital converter is connected with an input terminal of the control circuit, a datum signal terminal of the analog-to-digital converter is connected with a reference signal terminal of a print recognition apparatus, and an output terminal of the control circuit is connected with the first switch circuit; the analog-to-digital converter is configured to convert a signal output by the differential amplifier into a digital signal, and to transmit the digital signal to the control circuit; the first switch circuit is configured to make the first input signal terminal connected with the reference signal terminal or grounded, and to make the second input signal terminal connected with the reference signal terminal or grounded, under control of the control circuit; and the control circuit is configured to control the first switch circuit to make the first input signal terminal connected with the reference signal terminal or grounded, and to make the second input signal terminal connected with the reference signal terminal or grounded, and when the first input signal terminal is connected with the reference signal terminal or grounded, and the second input signal terminal is connected with the reference signal terminal or grounded, to analyze the digital signal output by the analog-to-digital converter to determine a source of noise of the print recognition apparatus.

In some embodiments, the noise detection circuit further includes a sample-and-hold circuit with at least two input terminals; and a first input terminal of the sample-and-hold circuit is connected with the first input signal terminal, a second input terminal of the sample-and-hold circuit is connected with the second input signal terminal, a first output terminal of the sample-and-hold circuit is connected with the positive input terminal of the differential amplifier, and a second output terminal of the sample-and-hold circuit is connected with the negative input terminal of the differential amplifier.

In some embodiments, the sample-and-hold circuit has N+2 input terminals, and N is a quantity of print read signal terminals of the print recognition apparatus; the noise detection circuit further includes a second switch circuit configured to make a third input terminal to an (N+2)-th input terminal of the sample-and-hold circuit connected respectively with the print read signal terminals of the print recognition apparatus, under the control of the control circuit; wherein one of the print read signal terminals of the print recognition apparatus corresponds to one input terminal of the sample-and-hold circuit, and different print read signal terminals of the print recognition apparatus correspond to different input terminals of the sample-and-hold circuit; and the control circuit is further configured to control the second switch circuit to make the third input terminal to the (N+2)-th input terminal of the sample-and-hold circuit connected respectively with corresponding print read signal terminals, and when the third input terminal to the (N+2)-th input terminal of the sample-and-hold circuit are connected respectively with the corresponding print read signal terminals, to analyze the digital signal output by the analog-to-digital converter to recognize a print, and to determine whether there is noise interference.

In some embodiments, the first switch circuit includes a first switch element and a second switch element, wherein: a control terminal of the first switch element is connected with a first output terminal of the control circuit, a first input terminal of the first switch element is connected with the reference signal terminal, a second input terminal of the first switch element is grounded, and an output terminal of the first switch element is connected with the first input signal terminal; and a control terminal of the second switch element is connected with a second output terminal of the control circuit, a first input terminal of the second switch element is connected with the reference signal terminal, a second input terminal of the second switch element is grounded, and an output terminal of the second switch element is connected with the second input signal terminal.

In some embodiments, the second switch circuit includes N switch elements and each of the N switch elements corresponds to one of the print read signal terminals; and an input terminal of an n-th switch element is connected with an n-th print read signal terminal, and an output terminal of the n-th switch element is connected with an (n+2)-th input terminal of the sample-and-hold circuit, wherein n is an integer greater than zero, and less than or equal to N; and a control terminal of each of the N switch elements is connected with a third output terminal of the control circuit.

In another aspect, the embodiments of the disclosure provide a print recognition apparatus including a noise detection circuit, wherein the noise detection circuit includes a differential amplifier, an analog-to-digital converter, a control circuit, and a first switch circuit, wherein: a negative input terminal of the differential amplifier is connected with a first input signal terminal, a positive input terminal of the differential amplifier is connected with a second input signal terminal, and an output terminal of the differential amplifier is connected with an input terminal of the analog-to-digital converter; an output terminal of the analog-to-digital converter is connected with an input terminal of the control circuit, a datum signal terminal of the analog-to-digital converter is connected with a reference signal terminal of a print recognition apparatus, and an output terminal of the control circuit is connected with the first switch circuit; the analog-to-digital converter is configured to convert a signal output by the differential amplifier into a digital signal, and to transmit the digital signal to the control circuit; the first switch circuit is configured to make the first input signal terminal connected with the reference signal terminal or grounded, and to make the second input signal terminal connected with the reference signal terminal or grounded, under control of the control circuit; and the control circuit is configured to control the first switch circuit to make the first input signal terminal connected with the reference signal terminal or grounded, and to make the second input signal terminal connected with the reference signal terminal or grounded, and when the first input signal terminal is connected with the reference signal terminal or grounded, and the second input signal terminal is connected with the reference signal terminal or grounded, to analyze the digital signal output by the analog-to-digital converter to determine a source of noise of the print recognition apparatus.

In some embodiments, the noise detection circuit further includes a sample-and-hold circuit with at least two input terminals; and a first input terminal of the sample-and-hold circuit is connected with the first input signal terminal, a second input terminal of the sample-and-hold circuit is connected with the second input signal terminal, a first output terminal of the sample-and-hold circuit is connected with the positive input terminal of the differential amplifier, and a second output terminal of the sample-and-hold circuit is connected with the negative input terminal of the differential amplifier.

In some embodiments, the sample-and-hold circuit has N+2 input terminals, and N is a number of print read signal terminals of the print recognition apparatus; the noise detection circuit further includes a second switch circuit configured to make a third input terminal to an (N+2)-th input terminal of the sample-and-hold circuit connected respectively with the print read signal terminals of the print recognition apparatus, under the control of the control circuit; wherein one of the print read signal terminals of the print recognition apparatus corresponds to one input terminal of the sample-and-hold circuit, and different print read signal terminals of the print recognition apparatus correspond to different input terminals of the sample-and-hold circuit; and the control circuit is further configured to control the second switch circuit to make the third input terminal to the (N+2)-th input terminal of the sample-and-hold circuit connected respectively with corresponding print read signal terminals, and when the third input terminal to the (N+2)-th input terminal of the sample-and-hold circuit are connected respectively with the corresponding print read signal terminals, to analyze the digital signal output by the analog-to-digital converter to recognize a print, and to determine whether there is noise interference.

In some embodiments, the first switch circuit includes a first switch element and a second switch element, wherein: a control terminal of the first switch element is connected with a first output terminal of the control circuit, a first input terminal of the first switch element is connected with the reference signal terminal, a second input terminal of the first switch element is grounded, and an output terminal of the first switch element is connected with the first input signal terminal; and a control terminal of the second switch element is connected with a second output terminal of the control circuit, a first input terminal of the second switch element is connected with the reference signal terminal, a second input terminal of the second switch element is grounded, and an output terminal of the second switch element is connected with the second input signal terminal.

In some embodiments, the second switch circuit includes N switch elements and each of the N switch elements corresponds to one of the print read signal terminals; and an input terminal of an n-th switch element is connected with an n-th print read signal terminal, and an output terminal of the n-th switch element is connected with an (n+2)-th input terminal of the sample-and-hold circuit, wherein n is an integer greater than zero, and less than or equal to N; and a control terminal of each of the N switch elements is connected with a third output terminal of the control circuit.

In still another aspect, the embodiments of the disclosure further provide a noise detection method of the noise detection circuit according to the embodiments of the disclosure, the method includes: controlling, by the control circuit, the first switch circuit to make both the first input signal terminal and the second input signal terminal grounded, when there is noise interference of the print recognition apparatus recognizing a print; determining whether a fluctuation amplitude of the digital signal, output by the analog-to-digital converter and received by the control circuit, lies in a first threshold range, when both the first input signal terminal and the second input signal terminal are grounded; and determining that noise comes from outside the print recognition apparatus, if the fluctuation amplitude of the digital signal, output by the analog-to-digital converter and received by the control circuit, lies in the first threshold range.

In some embodiments, when both the first input signal terminal and the second input signal terminal are grounded, the method further includes: controlling, by the control circuit, the first switch circuit to make the first input signal terminal grounded and to make the second input signal terminal connected with the reference signal terminal, if the fluctuation amplitude of the digital signal, output by the analog-digital converter and received by the control circuit, lies out of the first threshold range; determining a fluctuation amplitude of a digital signal received by the control circuit, when the first input signal terminal is grounded and the second input signal terminal is connected with the reference signal terminal; controlling, by the control circuit, the first switch circuit to make the first input signal terminal connected with the reference signal terminal and to make the second input signal terminal grounded, if the fluctuation amplitude of the digital signal, received by the control circuit when the first input signal terminal is grounded and the second input signal terminal is connected with the reference signal terminal, lies in a second threshold range; and determining whether the noise in recognizing the print comes from a reference signal source of the print recognition apparatus, according to a fluctuation amplitude of a digital signal currently received by the control circuit, and the fluctuation amplitude of the digital signal received by the control circuit when the first input signal terminal is grounded and the second input signal terminal is connected with the reference signal terminal, where the reference signal source is configured to provide a reference signal to the reference signal terminal.

In some embodiments, determining whether the noise in recognizing the print comes from the reference signal source of the print recognition apparatus, according to the fluctuation amplitude of the digital signal currently received by the control circuit, and the fluctuation amplitude of the digital signal received by the control circuit when the first input signal terminal is grounded and the second input signal terminal is connected with the reference signal terminal, includes: if the fluctuation amplitude of the digital signal currently received by the control circuit lies out of a preset range of the fluctuation amplitude of the digital signal received by the control circuit when the first input signal terminal is grounded and the second input signal terminal is connected with the reference signal terminal, then: determining whether the noise in recognizing the print comes from the reference signal source by reconfiguring the reference signal source.

In some embodiments, determining whether the noise in recognizing the print comes from the reference signal source by reconfiguring the reference signal source includes: reconfiguring, by the control circuit, the reference signal source, and recording a number of times that the reference signal source is configured; determining whether the number of times that the reference signal source is configured is less than K, wherein K is an integer greater than 1; if the number of times that the reference signal source is configured is less than K, then determining whether the fluctuation amplitude of the digital signal currently received by the control circuit still lies out of the preset range of the fluctuation amplitude of the digital signal received by the control circuit when the first input signal terminal is grounded and the second input signal terminal is connected with the reference signal terminal; if so, then reconfiguring, by the control circuit, the reference signal source until the number of times that the reference signal source is configured is greater than or equal to N, and determining that the noise results from a damage of the reference signal source.

In some embodiments, when the first input signal terminal is connected with the reference signal terminal, and the second input signal terminal is grounded, the method further includes: if a difference between the fluctuation amplitude of the digital signal currently received by the control circuit, and the fluctuation amplitude of the digital signal received by the control circuit when the first input signal terminal is grounded and the second input signal terminal is connected with the reference signal terminal lies in a preset range, then storing, by the control circuit, an error code for an analysis by a user.

In some embodiments, when the first input signal terminal is grounded, and the second input signal terminal is connected with the reference signal terminal, the method further includes: if the fluctuation amplitude of the digital signal received by the control circuit when the first input signal terminal is grounded and the second input signal terminal is connected with the reference signal terminal lies out of the second threshold range, then restarting the print recognition apparatus, and recording a number of times that the print recognition apparatus is restarted; determining whether there is noise interference in recognizing the print, after the print recognition apparatus is restarted; if there is noise interference, then determining whether the number of times that the print recognition apparatus is restarted is less than M, wherein M is an integer greater than 1; and if the number of times that the print recognition apparatus is restarted is less than M, then further restarting the print recognition apparatus until the number of times that the print recognition apparatus is restarted is greater than or equal to M, and determining that the noise comes from a power supply of the print recognition apparatus.

In some embodiments, after it is determined whether there is noise interference in recognizing the print, after the print recognition apparatus is restarted, the method further includes: if there is no noise, then determining that the noise comes from an operating error in hardware of the print recognition apparatus.

In some embodiments, K=2.

In some embodiments, M=3.

BRIEF DESCRIPTION OF THE DRAWINGS

In order to make the technical solutions according to embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
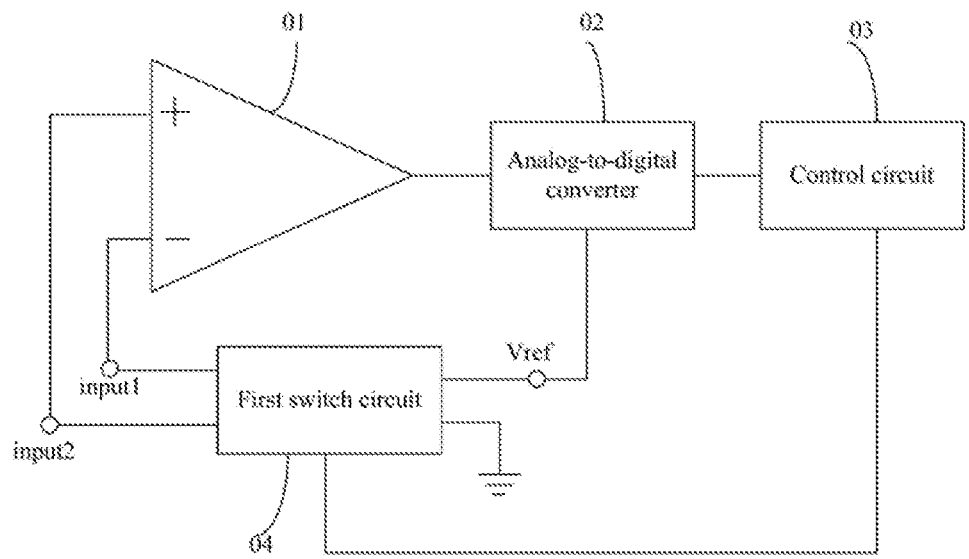
FIG. 1 is a first schematic structural diagram of a noise detection circuit according to the embodiments of the disclosure.

For an optical print recognition apparatus in the related art, it is both difficult and crucial to analyze and remove noise in a system, since there are various sources of noise, e.g., noise outside the system, including wave interference in the air, crosstalk from noise in the mains supply, etc., or noise inside a circuit system, including mutual interference between electronic elements due to unreasonable circuit wiring, 1/f noise in an electronic element due to poor welding of a pin, shot noise and burst noise specific to a semiconductor element, thermal noise in a resistive element, etc. Furthermore noise may also be introduced to the optical print recognition apparatus being manually debugged and tested, thus making it so difficult to remove the noise that it tends to take a significant labor effort and period of time to remove the noise, but the noise may not be removed satisfactorily. Accordingly it remains highly desirable to recognize and remove the noise while the print recognition apparatus is being developed.

Based upon this, the embodiments of the disclosure provide a noise detection circuit, a noise detection method and a print recognition apparatus.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure.

The sizes and shapes of respective components in the drawings are not intended to reflect any real proportion, but only intended to illustrate the content of the disclosure.

As illustrated in FIG. 1, the embodiments of the disclosure provide a noise detection circuit applicable to a print recognition apparatus; where the noise detection circuit includes a differential amplifier 01, an analog-to-digital converter 02, a control circuit 03 and a first switch circuit 04.

Where a negative input terminal (i.e. an inverting input terminal) of the differential amplifier 01 is connected with a first input signal terminal input1, a positive input terminal (i.e. a non-inverting input terminal) of the differential amplifier 01 is connected with a second input signal terminal input2, and an output terminal of the differential amplifier 01 is connected with an input terminal of the analog-to-digital converter 02; an output terminal of the analog-to-digital converter 02 is connected with an input terminal of the control circuit 03, and a datum signal terminal of the analog-to-digital converter 02 is connected with a reference signal terminal Vref of the print recognition apparatus; and an output terminal of the control circuit 03 is connected with the first switch circuit 04.

Where the analog-to-digital converter 02 is configured to convert a signal output by the differential amplifier 01 into a digital signal, and to transmit the digital signal to the control circuit 03.

The first switch circuit 04 is configured to make the first input signal terminal input1 connected with the reference signal terminal Vref or grounded GND, and to make the second input signal terminal input2 connected with the reference signal terminal Vref or grounded, under the control of the control circuit 03.

The control circuit 03 is configured to control the first switch circuit 04 to make the first input signal terminal input1 connected with the reference signal terminal Vref or grounded, and to make the second input signal terminal input2 connected with the reference signal terminal Vref or grounded; and when the first input signal terminal input1 is connected with the reference signal terminal Vref or grounded, and the second input signal terminal input2 is connected with the reference signal terminal Vref or grounded, to analyze the digital signal output by the analog-to-digital converter 02 to determine a source of noise of the print recognition apparatus.

In the noise detection circuit according to the embodiments of the disclosure, the first switch circuit is controlled by the control circuit to make the first input signal terminal connected with the reference signal terminal or grounded, and to make the second input signal terminal connected with the reference signal terminal or grounded, so that the differential amplifier performs an operation on received signals of the first input signal terminal and the second input signal terminal in different instances, and a result of the operation is converted by the analog-to-digital converter into a digital signal, so that the control circuit analyzes the digital signal output by the analog-to-digital converter to determine a source of noise of the print recognition apparatus.

Figure 2:
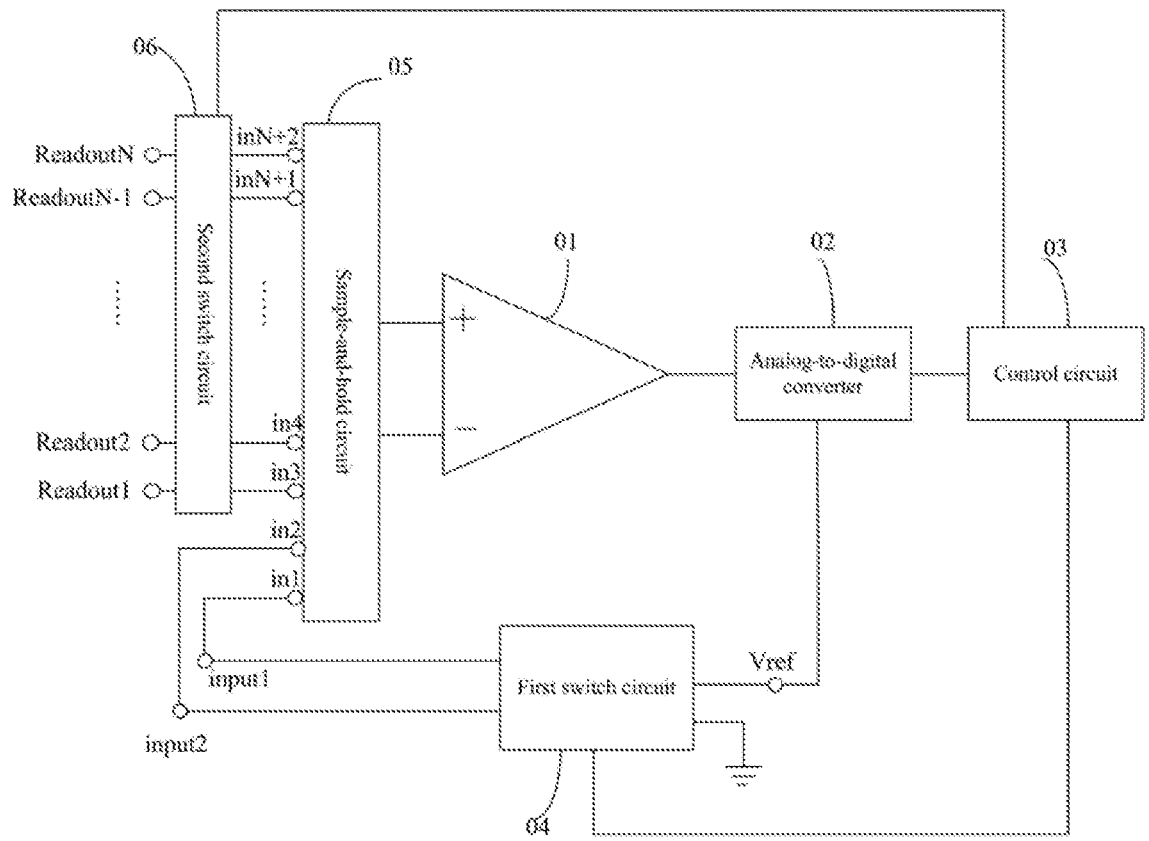
FIG. 2 is a second schematic structural diagram of a noise detection circuit according to the embodiments of the disclosure.

In some embodiments, in the noise detection circuit according to the embodiments of the disclosure, as illustrated in FIG. 2, the noise detection circuit further includes a sample-and-hold circuit 05 with at least two input terminals in1 to inN+2.

Where a first input terminal in1 of the sample-and-hold circuit 05 is connected with the first input signal terminal input1, a second input terminal in2 of the sample-and-hold circuit 05 is connected with the second input signal terminal input2, a first output terminal of the sample-and-hold circuit 05 is connected with the positive input terminal of the differential amplifier 01, and a second output terminal of the sample-and-hold circuit 05 is connected with the negative input terminal of the differential amplifier 01.

In some embodiments, in the noise detection circuit according to the embodiments of the disclosure, as illustrated in FIG. 2, the sample-and-hold circuit 05 has N+2 input terminals in1 to inN+2, where N is the number of print read signal terminals Readout of the print recognition apparatus.

The noise detection circuit further includes a second switch circuit 06 configured to make the third input terminal in3 to the (N+2)-th input terminal inN+2 of the sample-and-hold circuit 05 connected respectively with the print read signal terminals Readout of the print recognition apparatus, under the control of the control circuit 03; where one of the print read signal terminals Readout of the print recognition apparatus corresponds to one input terminal of the sample-and-hold circuit, and different print read signal terminals of the print recognition apparatus correspond to different input terminals of the sample-and-hold circuit.

The control circuit 03 is further configured to control the second switch circuit 06 to make the third input terminal in3 to the (N+2)-th input terminal inN+2 of the sample-and-hold circuit 05 connected respectively with corresponding print read signal terminals Readout, and when the third input terminal in3 to the (N+2)-th input terminal inN+2 of the sample-and-hold circuit 05 are connected respectively with the corresponding print read signal terminals Readout, to analyze the digital signal output by the analog-to-digital converter 02 to recognize a print (such as a fingerprint or the like), and to determine whether there is noise interference.

In the noise detection circuit above according to the embodiments of the disclosure, the sample-and-hold circuit not only receives the signals of the first input terminal and the second input terminal, and but also receives signals of the print read signal terminals; and when the signals of the first input terminal and the second input terminal are received, a source of noise can be determined; and when the signals of the print read signal terminals are received, the signals of the plurality of print read signal terminals can be held, and then amplified by the differential amplifier until they are appropriate for conversion by the analog-to-digital converter, and finally the amplified voltage signals are converted by the analog-to-digital converter into digital signals, and then the control circuit performs operations on the digital signals to thereby obtain resulting valley and ridge signals so as to recognize a print. Where the print recognition principle is the same as in the related art, so a repeated description thereof will be omitted here. Accordingly the noise detection circuit according to the embodiments of the disclosure not only can determine a source of noise of the print recognition apparatus, but also can recognize a print.

Since a print recognition apparatus in the related art also recognizes a print using a sample-and-hold circuit, a differential amplifier, an analog-to-digital converter and a control circuit, the noise detection circuit according to the embodiments of the disclosure is equivalent to the print recognition apparatus in the related art to which the first switch circuit is added, thus resulting in a low cost thereof.

Figure 3:
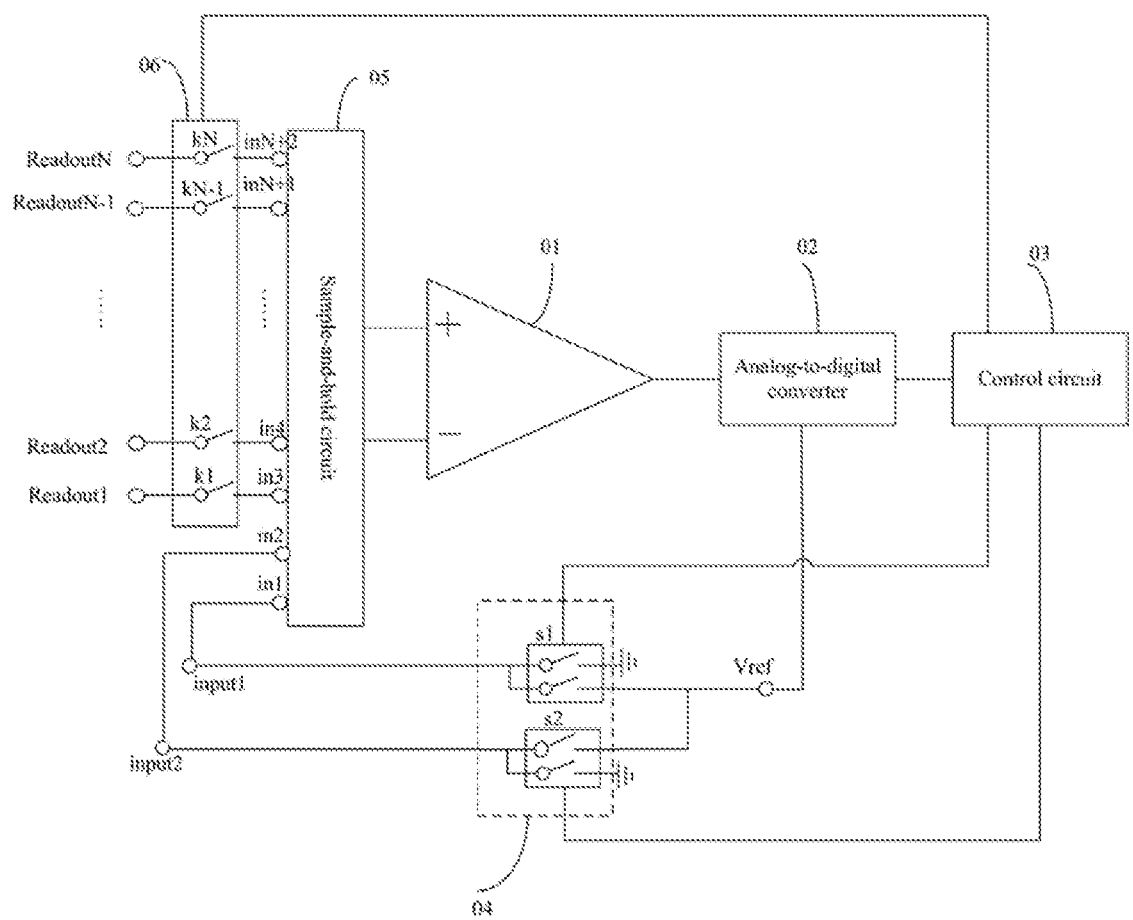
FIG. 3 is a third schematic structural diagram of a noise detection circuit according to the embodiments of the disclosure.

In some embodiments, in the noise detection circuit according to the embodiments of the disclosure, as illustrated in FIG. 3, the first switch circuit 04 includes a first switch element s1 and a second switch element s2.

A control terminal of the first switch element s1 is connected with a first output terminal of the control circuit 03, a first input terminal of the first switch element s1 is connected with the reference signal terminal Vref, a second input terminal of the first switch element s1 is grounded, and an output terminal of the first switch element s1 is connected with the first input signal terminal Input1.

A control terminal of the second switch element s2 is connected with a second output terminal of the control circuit 03, a first input terminal of the second switch element s2 is connected with the reference signal terminal Vref, a second input terminal of the second switch element s2 is grounded, and an output terminal of the second switch element s2 is connected with the second input signal terminal Input 2.

In some embodiments, in the noise detection circuit according to the embodiments of the disclosure, as illustrated in FIG. 3, the second switch circuit includes N switch elements k1 to kN, where each switch element k corresponds to one of the print read signal terminals Readout.

An input terminal of the n-th switch element kn is connected with the n-th print read signal terminal, and an output terminal of the n-th switch element kn is connected with the (n+2)-th input terminal inn+2 of the sample-and-hold circuit, where n is an integer greater than zero, and less than or equal to N; and control terminals of respective switch elements k are connected with a third output terminal of the control circuit 03.

An operating principle of the noise detection circuit according to the embodiments of the disclosure will be introduced below in details in connection with a noise detection method thereof.

Figure 4:
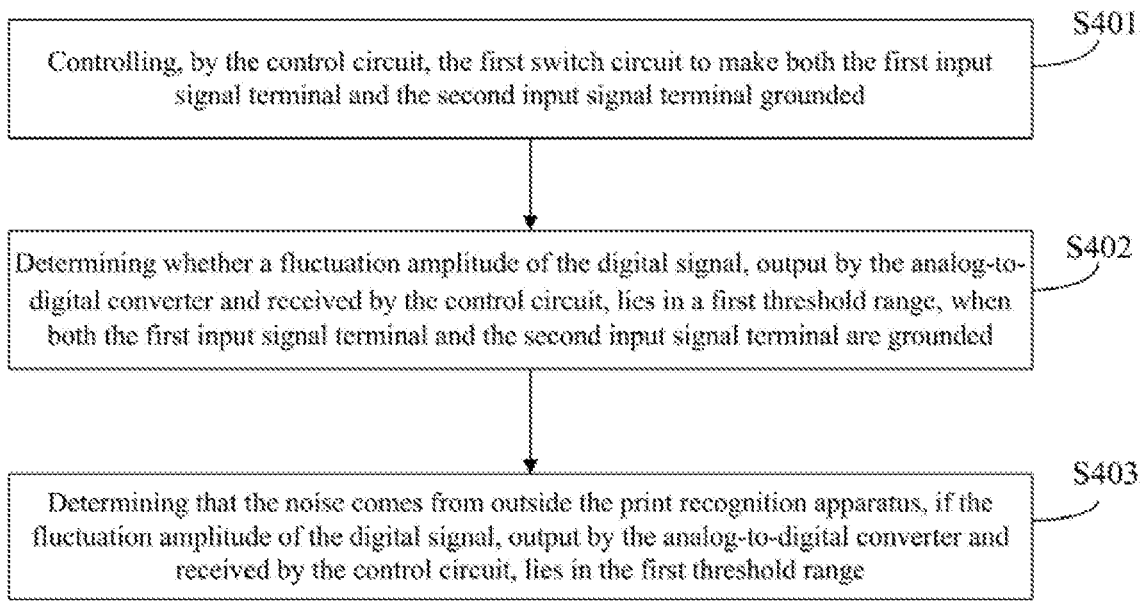
FIG. 4 is a first schematic flow chart of a noise detection method according to the embodiments of the disclosure.

Based upon the same inventive concept, the embodiments of the disclosure further provide a noise detection method of the noise detection circuit above, and when there is noise interference of the print recognition apparatus recognizing a print, as illustrated in FIG. 4, the method includes the following operations.

Operation S401, controlling, by the control circuit, the first switch circuit to make both the first input signal terminal and the second input signal terminal grounded.

Operation S402, determining whether a fluctuation amplitude of the digital signal, output by the analog-to-digital converter and received by the control circuit, lies in a first threshold range, when both the first input signal terminal and the second input signal terminal are grounded.

Operation S403, determining that the noise comes from outside the print recognition apparatus, if the fluctuation amplitude of the digital signal, output by the analog-to-digital converter and received by the control circuit, lies in the first threshold range.

In the noise detection method above according to the embodiments of the disclosure, since the signal output by the differential amplifier is determined by the difference between the sum of the signal and noise of the second input signal terminal, and the sum of the signal and noise of the first input signal terminal, when both the first input signal terminal and the second input signal terminal are grounded, a signal obtained by the differential amplifier is 0+noise(0)-0−noise(0), and if the digital signal output by the analog-to-digital converter fluctuates by an amplitude lying in the first threshold range, then it will indicate insignificant noise inside the system, so it can be determined that noise at this time primarily comes from outside the print recognition apparatus instead of inside the system of the print recognition apparatus, and may result from electromagnetic wave interference from the outside. If such noise exists in the system, then the noise may be removed by adding a shielding case.

In some embodiments, in the noise detection method above according to the embodiments of the disclosure, when both the first input signal terminal and the second input signal terminal are grounded, if the fluctuation amplitude of the digital signal, output by the analog-digital converter and received by the control circuit, lies out of the first threshold range, then it will indicate that noise may come from inside the print recognition apparatus, and a source of the noise will be further determined as follows.

Controlling, by the control circuit, the first switch circuit to make the first input signal terminal grounded and to make the second input signal terminal connected with the reference signal terminal.

Determining a fluctuation amplitude of a digital signal received by the control circuit, when the first input signal terminal is grounded and the second input signal terminal is connected with the reference signal terminal.

Controlling, by the control circuit, the first switch circuit to make the first input signal terminal connected with the reference signal terminal and to make the second input signal terminal grounded, if the fluctuation amplitude of the digital signal, received by the control circuit when the first input signal terminal is grounded and the second input signal terminal is connected with the reference signal terminal, lies in a second threshold range.

Determining whether the noise in recognizing a print comes from a reference signal source of the print recognition apparatus, according to a fluctuation amplitude of a digital signal currently received by the control circuit, and the fluctuation amplitude of the digital signal received by the control circuit when the first input signal terminal is grounded and the second input signal terminal is connected with the reference signal terminal; where the reference signal source is configured to provide a reference signal to the reference signal terminal.

In some embodiments, when the first input signal terminal is grounded, and the second input signal terminal is connected with the reference signal terminal, a signal obtained by the differential amplifier at this time is Vref+noise(Vref)-0−noise(0), and since the datum signal terminal of the analog-to-digital converter is connected with the reference signal terminal, the noise at the reference signal terminal and the noise of a datum signal source of the analog-to-digital converter will have the same behaviors, thus if the fluctuation amplitude of the digital signal currently received by the control circuit at this time is still significant, then the noise may come from the reference signal source of the print recognition apparatus. This is because if there is noise interference in the reference signal source, then a signal may not be quantified accurately by the analog-to-digital converter, so that a resulting digital signal will fluctuate by a significant amplitude.

In some embodiments, when the first input signal terminal is connected with the reference signal terminal and the second input signal terminal is grounded, a signal obtained by the differential amplifier at this time is 0+noise(0)-Vref−noise(Vref), and since a noise behavior of a reference signal among the signal output by the differential amplifier is contrary to a noise behavior of a datum signal source of the analog-to-digital converter, if the digital signal output by the analog-to-digital converter at this time fluctuates by a significant amplitude, then it will indicate that the noise comes from the reference signal source.

In some embodiments, in the noise detection method above according to the embodiments of the disclosure, it is determined as follows whether the noise in recognizing a print comes from the reference signal source of the print recognition apparatus, according to the fluctuation amplitude of the digital signal currently received by the control circuit, and the fluctuation amplitude of the digital signal received by the control circuit when the first input signal terminal is grounded and the second input signal terminal is connected with the reference signal terminal.

If the fluctuation amplitude of the digital signal currently received by the control circuit lies out of a preset range of the fluctuation amplitude of the digital signal received by the control circuit when the first input signal terminal is grounded and the second input signal terminal is connected with the reference signal terminal, then: determining whether the noise in recognizing the print comes from the reference signal source by reconfiguring the reference signal source.

In some embodiments, it is determined as follows whether the noise in recognizing the print comes from the reference signal source by reconfiguring the reference signal source: if the noise is still significant after the reference signal source is reconfigured repeatedly, then it may be determined that the noise comes from a hardware damage of the reference signal source (for example, 1/f noise, shot noise, etc., specific to an element of the reference signal source may be raised, or an element of the reference signal source may have been burned), so the noise interference can be removed by replacing the reference signal source with a new one.

In some embodiments, in the noise detection method above according to the embodiments of the disclosure, it is determined as follows whether the noise in recognizing the print comes from the reference signal source by reconfiguring the reference signal source.

Reconfiguring, by the control circuit, the reference signal source, and recording the number of times that the reference signal source is configured.

Determining whether the number of times that the reference signal source is configured is less than K.

If the number of times that the reference signal source is configured is less than K, then determining whether the fluctuation amplitude of the digital signal currently received by the control circuit still lies out of the preset range of the fluctuation amplitude of the digital signal received by the control circuit when the first input signal terminal is grounded and the second input signal terminal is connected with the reference signal terminal; if so, then reconfiguring, by the control circuit, the reference signal source until the number of times that the reference signal source is configured is greater than or equal to N, and determining that the noise results from a damage of the reference signal source.

In some embodiments, in the noise detection method according to the embodiments of the disclosure, K is an integer greater than 1, for example, K is generally 2.

In some embodiments, in the noise detection method according to the embodiments of the disclosure, when the first input signal terminal is connected with the reference signal terminal, and the second input signal terminal is grounded, the method further includes following operations.

If a difference between the fluctuation amplitude of the digital signal currently received by the control circuit, and the fluctuation amplitude of the digital signal received by the control circuit when the first input signal terminal is grounded and the second input signal terminal is connected with the reference signal terminal lies in a preset range, then storing, by the control circuit, an error code for an analysis by a user.

In some embodiments, when the first input signal terminal is grounded, and the second input signal terminal is connected with the reference signal terminal, if the fluctuation amplitude of the digital signal currently received by the control circuit lies out of the second threshold range, then it will indicate that the noise does not come from the reference signal source, and it will be determined whether the noise comes from the print recognition apparatus.

Accordingly, in some embodiments, in the noise detection method according to the embodiments of the disclosure, when the first input signal terminal is grounded, and the second input signal terminal is connected with the reference signal terminal, the method further includes the following operations.

If the fluctuation amplitude of the digital signal received by the control circuit when the first input signal terminal is grounded and the second input signal terminal is connected with the reference signal terminal lies out of the second threshold range, then restarting the print recognition apparatus, and recording the number of times that the print recognition apparatus is restarted.

Determining whether there is noise interference in recognizing the print, after the print recognition apparatus is restarted; and if there is noise interference, then determining whether the number of times that the print recognition apparatus is restarted is less than M.

If the number of times that the print recognition apparatus is restarted is less than M, then further restarting the print recognition apparatus until the number of times that the print recognition apparatus is restarted is greater than or equal to M, and determining that the noise comes from a power supply of the print recognition apparatus.

In some embodiments, in the noise detection method according to the embodiments of the disclosure, M is an integer greater than 1, for example, M is generally 3.

In some embodiments, the noise resulting from the power supply can be addressed by replacing the power supply with a power supply (e.g., a Uninterruptable Power System, UPS) with higher performance.

In some embodiments, in the noise detection method according to the embodiments of the disclosure, after it is determined whether there is noise interference in recognizing the print, after the print recognition apparatus is restarted, the method further includes: if there is no noise, then determining that the noise comes from an operating error in hardware of the print recognition apparatus.

Figure 5:
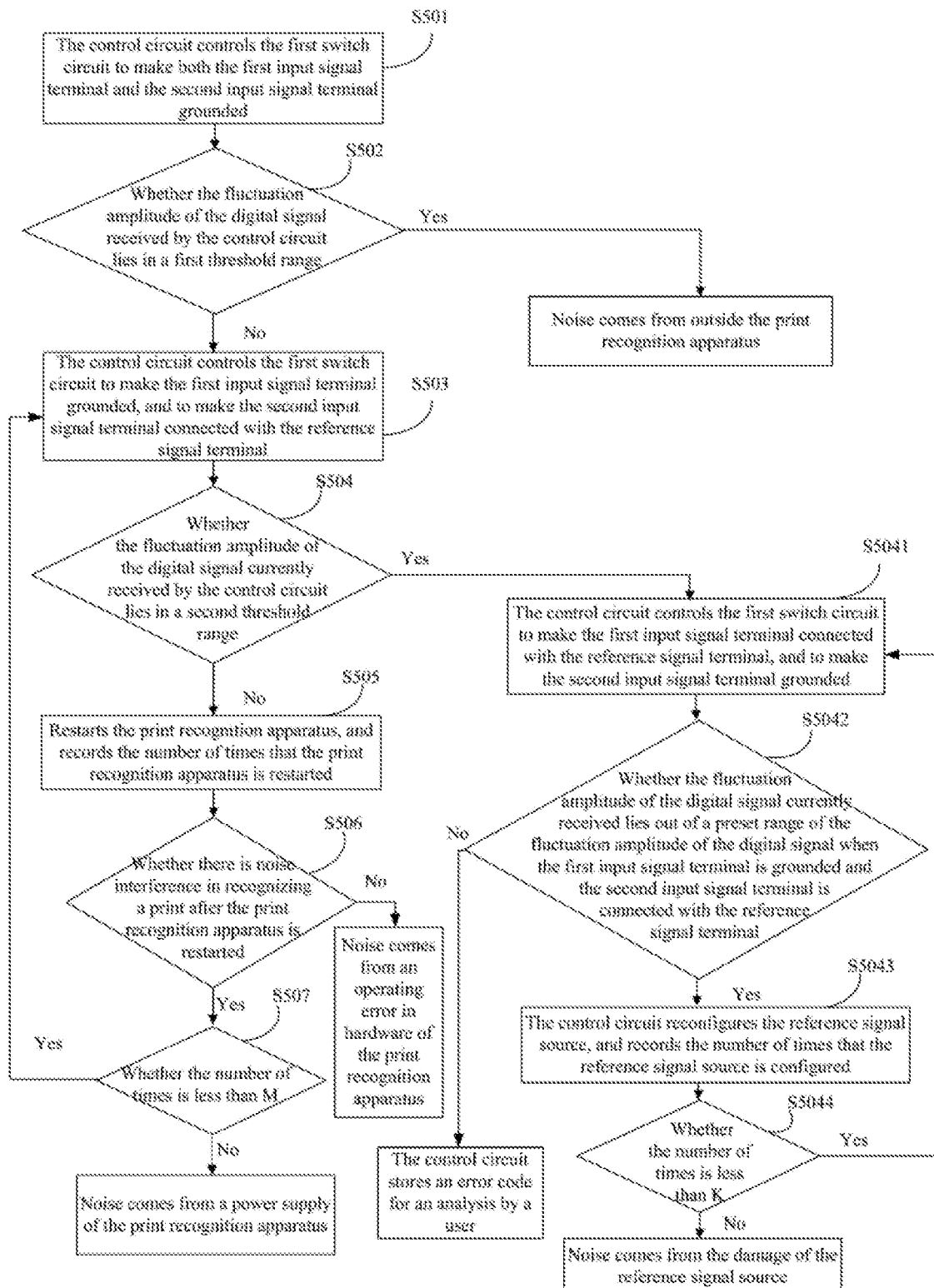
FIG. 5 is a second schematic flow chart of a noise detection method according to the embodiments of the disclosure.

The noise detection method according to the embodiments of the disclosure will be described below in details in connection with the noise detection circuit as illustrated in FIG. 3. When there is noise interference of the print recognition apparatus recognizing a print, a source of the noise can be determined in the following operations as illustrated in FIG. 5.

In the operation S501, the control circuit controls the first switch circuit to make both the first input signal terminal and the second input signal terminal grounded.

In the operation S502, the control circuit determines whether the fluctuation amplitude of the digital signal, output by the analog-to-digital converter and received by the control circuit, lies in a first threshold range.

If the fluctuation amplitude lies out of the first threshold range, then the control circuit will proceed to the operation S503; and if the fluctuation amplitude lies in the first threshold range, then the control circuit will determine that the noise comes from outside the print recognition apparatus.

In the operation S503, the control circuit controls the first switch circuit to make the first input signal terminal grounded, and to make the second input signal terminal connected with the reference signal terminal.

In the operation S504, the control circuit determines whether the fluctuation amplitude of the digital signal currently received by the control circuit lies in a second threshold range. If the fluctuation amplitude lies out of the second threshold range, then the control circuit will proceed to the operation S505; and if the fluctuation amplitude lies in the second threshold range, then the control circuit will proceed to the operation S5041.

In the operation S505, the control circuit restarts the print recognition apparatus, and records the number of times that the print recognition apparatus is restarted.

In the operation S506, the control circuit determines whether there is noise interference in recognizing a print after the print recognition apparatus is restarted. If there is noise interference, then the control circuit will proceed to the operation S507; and if there is no noise, then the control circuit will determine that the noise comes from an operating error in hardware of the print recognition apparatus.

In the operation S507, the control circuit determines whether the number of times that the print recognition apparatus is restarted is less than M. If the number of times that the print recognition apparatus is restarted is less than M, then the control circuit will return to the operation S503; and if the number of times that the print recognition apparatus is restarted is greater than or equal to M, then the control circuit will determine that the noise comes from a power supply of the print recognition apparatus.

In the operation S5041, the control circuit controls the first switch circuit to make the first input signal terminal connected with the reference signal terminal, and to make the second input signal terminal grounded.

In the operation S5042, the control circuit determines whether the fluctuation amplitude of the digital signal currently received by the control circuit lies out of a preset range of the fluctuation amplitude of the digital signal received by the control circuit when the first input signal terminal is grounded and the second input signal terminal is connected with the reference signal terminal. If the fluctuation amplitude of the digital signal currently received by the control circuit lies out of the preset range, then the control circuit will proceed to the operation S5043; and if the fluctuation amplitude of the digital signal currently received by the control circuit does not lie out of the preset range, then the control circuit will store an error code for an analysis by a user.

In the operation S5043, the control circuit reconfigures the reference signal source, and records the number of times that the reference signal source is configured.

In the operation S5044, the control circuit determines whether the number of times that the reference signal source is configured is less than K.

If the number of times that the reference signal source is configured is less than K, then the control circuit will return to the operation S5041; and if the number of times that the reference signal source is configured is greater than or equal to K, then the control circuit will determine that the noise comes from the damage of the reference signal source.

Based upon the same inventive concept, the embodiments of the disclosure further provide a print recognition apparatus including the noise detection circuit according to any one of the embodiments above of the disclosure. Since the print recognition apparatus addresses the problem under a similar principle to the noise detection circuit, reference can be made to the implementation of the noise detection circuit for an implementation of the print recognition apparatus, thus a repeated description thereof will be omitted here.

Figure 6:
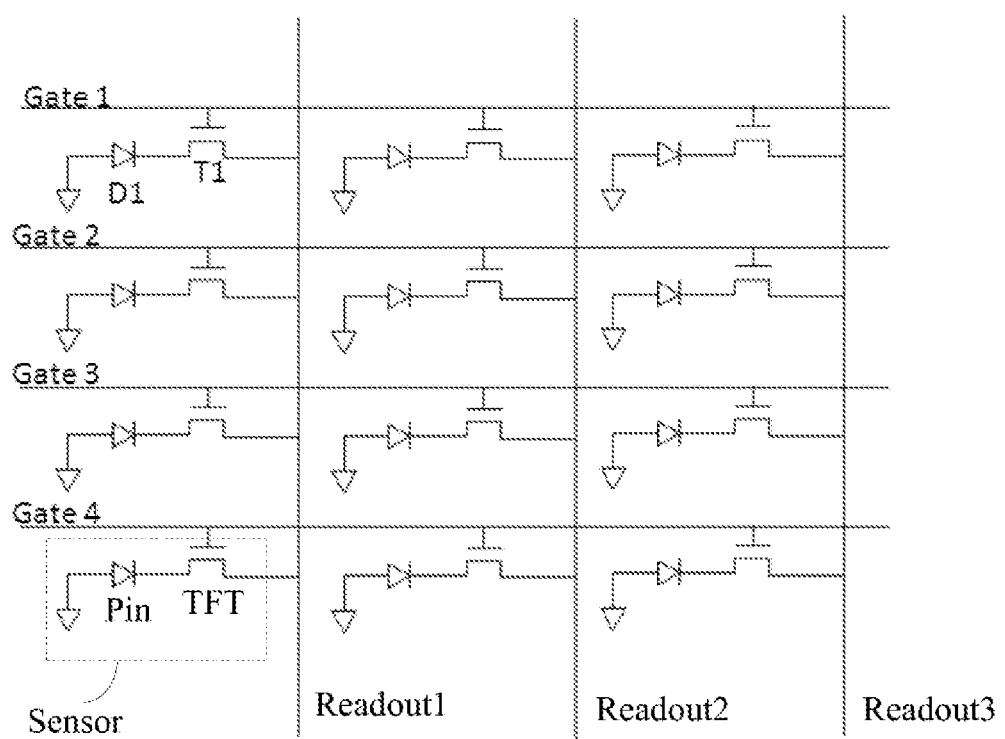
FIG. 6 is a first schematic structural diagram of a print recognition apparatus according to the embodiments of the disclosure.

In some embodiments, as illustrated in FIG. 6, the print recognition apparatus generally further includes several sensors arranged in a matrix, where each of the sensors includes a photosensitive diode (i.e. the pin as illustrated in FIG. 6) and at least one Thin Film Transistor (TFT). While a fingerprint is being scanned, a light source incident on a finger is reflected differently due to the difference between a valley and a ridge of the fingerprint, so that the strengths of light arriving at the photosensitive diodes vary from each other, thus resulting in different light current; and the different current of the respective photosensitive diodes can be read out in sequence simply by acquiring the signals of the print read signal terminals Readout under the control of the Thin Film Transistors (TFTs), to thereby detect the valley and the ridge of the fingerprint.

Figure 7:
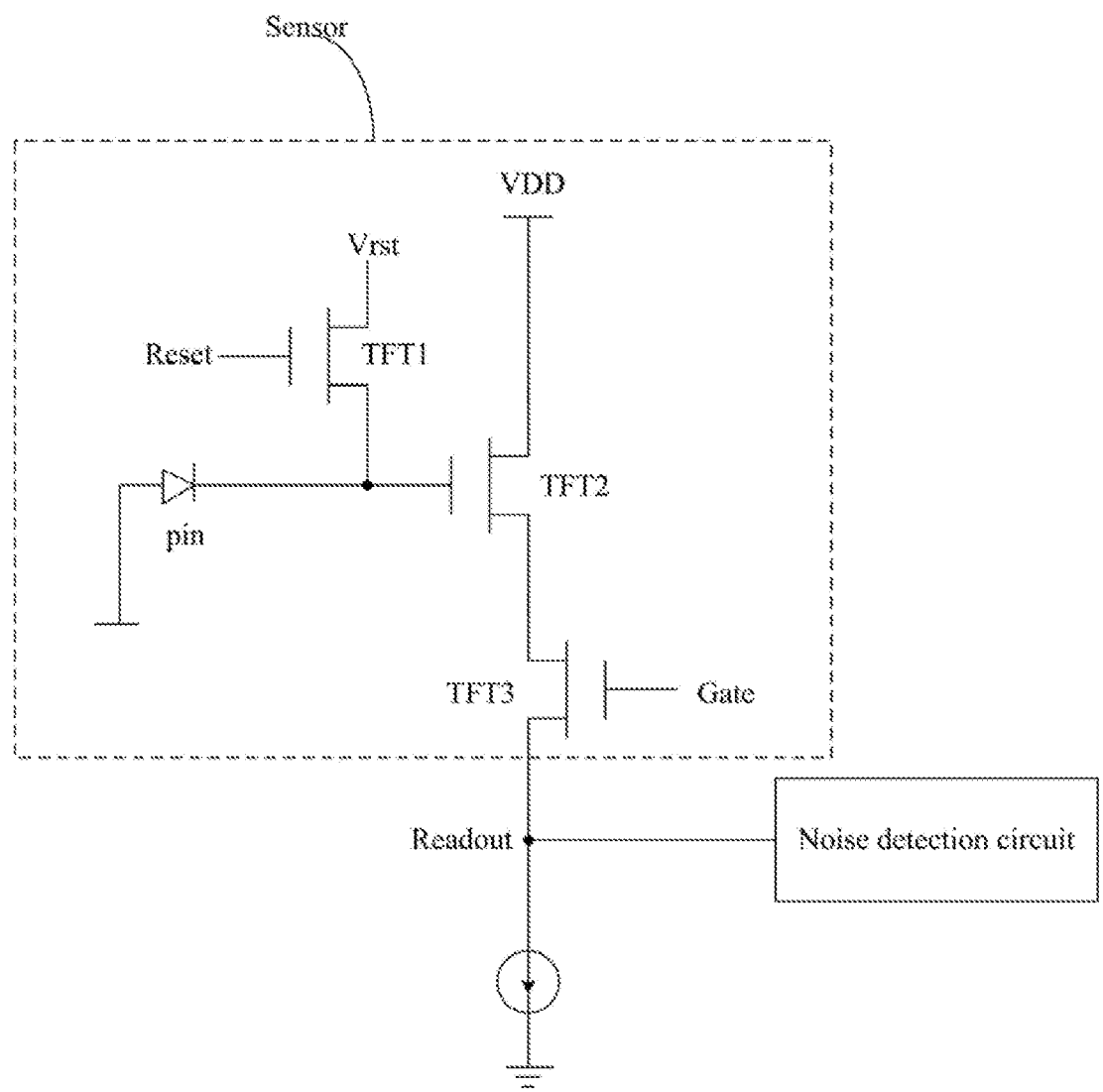
FIG. 7 is a second schematic structural diagram of a print recognition apparatus according to the embodiments of the disclosure.

In some embodiments, each of the sensors includes a photosensitive diode, and three thin film transistors T1, T2, and T3 as illustrated in FIG. 7. A print signal sensed by each of the sensors is provided to the noise detection circuit through a print read signal terminal Readout to recognize a print.

In some embodiments, the print recognition apparatus is a separately arranged device, e.g., a fingerprint unlocking device; or of course, the print recognition apparatus can alternatively be integrated with a display device, although the embodiments of the disclosure will not be limited thereto.

Figure 8:
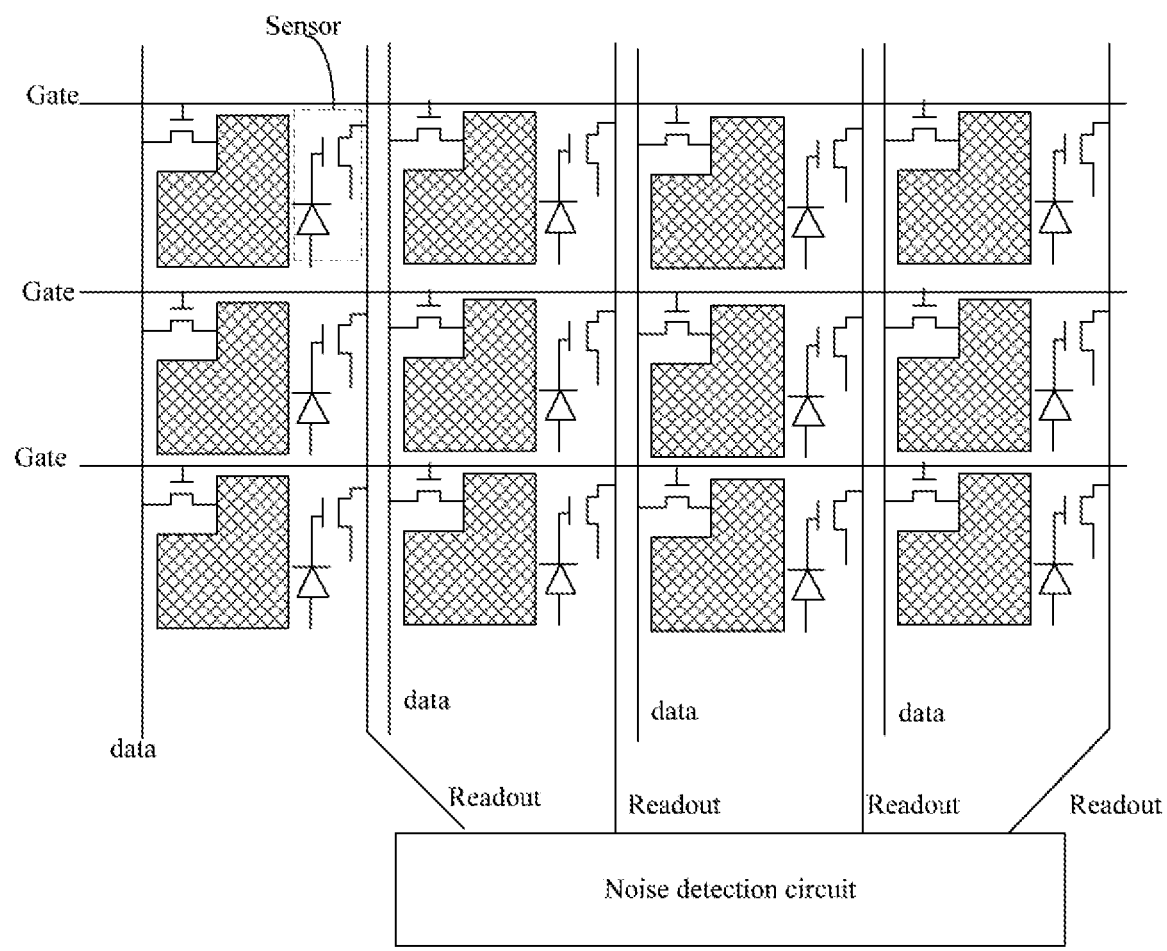
FIG. 8 is a third schematic structural diagram of a print recognition apparatus according to the embodiments of the disclosure.

In some embodiments, when the sensors of the print recognition apparatus are distributed throughout a display area, a finger can be recognized throughout a screen. In some embodiments, when the sensors are arranged in the display area, each pixel region of the display panel is provided with a sensor as illustrated in FIG. 8. Further, in some embodiments, the sensors are arranged in an area corresponding to a black matrix, so as to neither hinder an image from being displayed nor lower an aperture ratio.

In the noise detection circuit, the noise detection method, and the print recognition apparatus above according to the embodiments of the disclosure, the first switch circuit is controlled by the control circuit to make the first input signal terminal connected with the reference signal terminal or grounded, and to make the second input signal terminal connected with the reference signal terminal or grounded, so that the differential amplifier performs an operation on received signals of the first input signal terminal and the second input signal terminal in different instances, and a result of the operation is converted by the analog-to-digital converter into a digital signal, so that the control circuit analyzes the digital signal output by the analog-to-digital converter to determine a source of noise of the print recognition apparatus.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A noise detection circuit, comprising: a differential amplifier, an analog-to-digital converter, a control circuit, and a first switch circuit, wherein:
   a negative input terminal of the differential amplifier is connected with a first input signal terminal, a positive input terminal of the differential amplifier is connected with a second input signal terminal, and an output terminal of the differential amplifier is connected with an input terminal of the analog-to-digital converter; an output terminal of the analog-to-digital converter is connected with an input terminal of the control circuit, a datum signal terminal of the analog-to-digital converter is connected with a reference signal terminal of a print recognition apparatus, and an output terminal of the control circuit is connected with the first switch circuit;
   the analog-to-digital converter is configured to convert a signal output by the differential amplifier into a digital signal, and to transmit the digital signal to the control circuit;
   the first switch circuit is configured to make the first input signal terminal connected with the reference signal terminal or grounded, and to make the second input signal terminal connected with the reference signal terminal or grounded, under control of the control circuit; and
   the control circuit is configured to control the first switch circuit to make the first input signal terminal connected with the reference signal terminal or grounded, and to make the second input signal terminal connected with the reference signal terminal or grounded; and
   when the first input signal terminal is connected with the reference signal terminal or grounded, and the second input signal terminal is connected with the reference signal terminal or grounded, to analyze the digital signal output by the analog-to-digital converter to determine a source of noise of the print recognition apparatus;
   wherein the noise detection circuit further comprises a sample-and-hold circuit with at least two input terminals; and a first input terminal of the sample-and-hold circuit is directly connected with the first input signal terminal, a second input terminal of the sample-and-hold circuit is directly connected with the second input signal terminal, a first output terminal of the sample-and-hold circuit is directly connected with the positive input terminal of the differential amplifier, and a second output terminal of the sample-and-hold circuit is directly connected with the negative input terminal of the differential amplifier.

2. The noise detection circuit according to claim 1, wherein the sample-and-hold circuit has N+2 input terminals, and N is a quantity of print read signal terminals of the print recognition apparatus;
   the noise detection circuit further comprises a second switch circuit configured to make a third input terminal to an (N+2)-th input terminal of the sample-and-hold circuit connected respectively with the print read signal terminals of the print recognition apparatus, under the control of the control circuit; wherein one of the print read signal terminals of the print recognition apparatus corresponds to one input terminal of the sample-and-hold circuit, and different print read signal terminals of the print recognition apparatus correspond to different input terminals of the sample-and-hold circuit; and
   the control circuit is further configured to control the second switch circuit to make the third input terminal to the (N+2)-th input terminal of the sample-and-hold circuit connected respectively with corresponding print read signal terminals, and when the third input terminal to the (N+2)-th input terminal of the sample-and-hold circuit are connected respectively with the corresponding print read signal terminals, to analyze the digital signal output by the analog-to-digital converter to recognize a print, and to determine whether there is noise interference.

3. The noise detection circuit according to claim 2, wherein the second switch circuit comprises N switch elements and each of the N switch elements corresponds to one of the print read signal terminals; and
   an input terminal of an n-th switch element is connected with an n-th print read signal terminal, and an output terminal of the n-th switch element is connected with an (n+2)-th input terminal of the sample-and-hold circuit, wherein n is an integer greater than zero, and less than or equal to N; and
   a control terminal of each of the N switch elements is connected with a third output terminal of the control circuit.

4. The noise detection circuit according to claim 1, wherein the first switch circuit comprises a first switch element and a second switch element, wherein:
   a control terminal of the first switch element is connected with a first output terminal of the control circuit, a first input terminal of the first switch element is connected with the reference signal terminal, a second input terminal of the first switch element is grounded, and an output terminal of the first switch element is connected with the first input signal terminal; and
   a control terminal of the second switch element is connected with a second output terminal of the control circuit, a first input terminal of the second switch element is connected with the reference signal terminal, a second input terminal of the second switch element is grounded, and an output terminal of the second switch element is connected with the second input signal terminal.

5. A noise detection method of the noise detection circuit according to claim 1, the method comprising:
   controlling, by the control circuit, the first switch circuit to make both the first input signal terminal and the second input signal terminal grounded, when there is noise interference of the print recognition apparatus recognizing a print;
   determining whether a fluctuation amplitude of the digital signal, output by the analog-to-digital converter and received by the control circuit, lies in a first threshold range, when both the first input signal terminal and the second input signal terminal are grounded; and
   determining that noise comes from outside the print recognition apparatus, if the fluctuation amplitude of the digital signal, output by the analog-to-digital converter and received by the control circuit, lies in the first threshold range.

6. The noise detection method according to claim 5, wherein when both the first input signal terminal and the second input signal terminal are grounded, the method further comprises:

controlling, by the control circuit, the first switch circuit to make the first input signal terminal grounded and to make the second input signal terminal connected with the reference signal terminal, if the fluctuation amplitude of the digital signal, output by the analog-digital converter and received by the control circuit, lies out of the first threshold range;

determining a fluctuation amplitude of a digital signal received by the control circuit, when the first input signal terminal is grounded and the second input signal terminal is connected with the reference signal terminal;

controlling, by the control circuit, the first switch circuit to make the first input signal terminal connected with the reference signal terminal and to make the second input signal terminal grounded, if the fluctuation amplitude of the digital signal, received by the control circuit when the first input signal terminal is grounded and the second input signal terminal is connected with the reference signal terminal, lies in a second threshold range; and determining whether the noise in recognizing the print comes from a reference signal source of the print recognition apparatus, according to a fluctuation amplitude of a digital signal currently received by the control circuit, and the fluctuation amplitude of the digital signal received by the control circuit when the first input signal terminal is grounded and the second input signal terminal is connected with the reference signal terminal, where the reference signal source is configured to provide a reference signal to the reference signal terminal.

7. The noise detection method according to claim 6, wherein determining whether the noise in recognizing the print comes from the reference signal source of the print recognition apparatus, according to the fluctuation amplitude of the digital signal currently received by the control circuit, and the fluctuation amplitude of the digital signal received by the control circuit when the first input signal terminal is grounded and the second input signal terminal is connected with the reference signal terminal, comprises:

if the fluctuation amplitude of the digital signal currently received by the control circuit lies out of a preset range of the fluctuation amplitude of the digital signal received by the control circuit when the first input signal terminal is grounded and the second input signal terminal is connected with the reference signal terminal, then:

determining whether the noise in recognizing the print comes from the reference signal source by reconfiguring the reference signal source.

8. The noise detection method according to claim 7, wherein determining whether the noise in recognizing the print comes from the reference signal source by reconfiguring the reference signal source comprises:

reconfiguring, by the control circuit, the reference signal source, and recording a number of times that the reference signal source is configured;

determining whether the number of times that the reference signal source is configured is less than K, wherein K is an integer greater than 1;

if the number of times that the reference signal source is configured is less than K, then determining whether the fluctuation amplitude of the digital signal currently received by the control circuit still lies out of the preset range of the fluctuation amplitude of the digital signal received by the control circuit when the first input signal terminal is grounded and the second input signal terminal is connected with the reference signal terminal;

if so, then reconfiguring, by the control circuit, the reference signal source until the number of times that the reference signal source is configured is greater than or equal to N, and determining that the noise results from a damage of the reference signal source.

9. The noise detection method according to claim 8, wherein K=2.

10. The noise detection method according to claim 6, wherein when the first input signal terminal is connected with the reference signal terminal, and the second input signal terminal is grounded, the method further comprises:

if a difference between the fluctuation amplitude of the digital signal currently received by the control circuit, and the fluctuation amplitude of the digital signal received by the control circuit when the first input signal terminal is grounded and the second input signal terminal is connected with the reference signal terminal lies in a preset range, then storing, by the control circuit, an error code for an analysis by a user.

11. The noise detection method according to claim 6, wherein when the first input signal terminal is grounded, and the second input signal terminal is connected with the reference signal terminal, the method further comprises:

if the fluctuation amplitude of the digital signal received by the control circuit when the first input signal terminal is grounded and the second input signal terminal is connected with the reference signal terminal lies out of the second threshold range, then restarting the print recognition apparatus, and recording a number of times that the print recognition apparatus is restarted;

determining whether there is noise interference in recognizing the print, after the print recognition apparatus is restarted;

if there is noise interference, then determining whether the number of times that the print recognition apparatus is restarted is less than M, wherein M is an integer greater than 1; and if the number of times that the print recognition apparatus is restarted is less than M, then further restarting the print recognition apparatus until the number of times that the print recognition apparatus is restarted is greater than or equal to M, and determining that the noise comes from a power supply of the print recognition apparatus.

12. The noise detection method according to claim 11, wherein after it is determined whether there is noise interference in recognizing the print, after the print recognition apparatus is restarted, the method further comprises:

if there is no noise, then determining that the noise comes from an operating error in hardware of the print recognition apparatus.

13. The noise detection method according to claim 11, wherein M=3.

14. A print recognition apparatus, comprising a noise detection circuit, wherein the noise detection circuit comprises a differential amplifier, an analog-to-digital converter, a control circuit, and a first switch circuit, wherein:
- a negative input terminal of the differential amplifier is connected with a first input signal terminal, a positive input terminal of the differential amplifier is connected with a second input signal terminal, and an output terminal of the differential amplifier is connected with an input terminal of the analog-to-digital converter; an output terminal of the analog-to-digital converter is connected with an input terminal of the control circuit, a datum signal terminal of the analog-to-digital converter is connected with a reference signal terminal of the print recognition apparatus, and an output terminal of the control circuit is connected with the first switch circuit;
- the analog-to-digital converter is configured to convert a signal output by the differential amplifier into a digital signal, and to transmit the digital signal to the control circuit;
- the first switch circuit is configured to make the first input signal terminal connected with the reference signal terminal or grounded, and to make the second input signal terminal connected with the reference signal terminal or grounded, under control of the control circuit; and
- the control circuit is configured to control the first switch circuit to make the first input signal terminal connected with the reference signal terminal or grounded, and to make the second input signal terminal connected with the reference signal terminal or grounded; and when the first input signal terminal is connected with the reference signal terminal or grounded, and the second input signal terminal is connected with the reference signal terminal or grounded, to analyze the digital signal output by the analog-to-digital converter to determine a source of noise of the print recognition apparatus;
- wherein the noise detection circuit further comprises a sample-and-hold circuit with at least two input terminals; and a first input terminal of the sample-and-hold circuit is directly connected with the first input signal terminal, a second input terminal of the sample-and-hold circuit is directly connected with the second input signal terminal, a first output terminal of the sample-and-hold circuit is directly connected with the positive input terminal of the differential amplifier, and a second output terminal of the sample-and-hold circuit is directly connected with the negative input terminal of the differential amplifier.

15. The print recognition apparatus according to claim 14, wherein the sample-and-hold circuit has N+2 input terminals, and N is a number of print read signal terminals of the print recognition apparatus;
- the noise detection circuit further comprises a second switch circuit configured to make a third input terminal to an (N+2)-th input terminal of the sample-and-hold circuit connected respectively with the print read signal terminals of the print recognition apparatus, under the control of the control circuit; wherein one of the print read signal terminals of the print recognition apparatus corresponds to one input terminal of the sample-and-hold circuit, and different print read signal terminals of the print recognition apparatus correspond to different input terminals of the sample-and-hold circuit; and
- the control circuit is further configured to control the second switch circuit to make the third input terminal to the (N+2)-th input terminal of the sample-and-hold circuit connected respectively with corresponding print read signal terminals, and when the third input terminal to the (N+2)-th input terminal of the sample-and-hold circuit are connected respectively with the corresponding print read signal terminals, to analyze the digital signal output by the analog-to-digital converter to recognize a print, and to determine whether there is noise interference.

16. The print recognition apparatus according to claim 15, wherein the second switch circuit comprises N switch elements and each of the N switch elements corresponds to one of the print read signal terminals; and
- an input terminal of an n-th switch element is connected with an n-th print read signal terminal, and an output terminal of the n-th switch element is connected with an (n+2)-th input terminal of the sample-and-hold circuit, wherein n is an integer greater than zero, and less than or equal to N; and
- a control terminal of each of the N switch elements is connected with a third output terminal of the control circuit.

17. The print recognition apparatus according to claim 14, wherein the first switch circuit comprises a first switch element and a second switch element, wherein:
- a control terminal of the first switch element is connected with a first output terminal of the control circuit, a first input terminal of the first switch element is connected with the reference signal terminal, a second input terminal of the first switch element is grounded, and an output terminal of the first switch element is connected with the first input signal terminal; and
- a control terminal of the second switch element is connected with a second output terminal of the control circuit, a first input terminal of the second switch element is connected with the reference signal terminal, a second input terminal of the second switch element is grounded, and an output terminal of the second switch element is connected with the second input signal terminal.

* * * * *